(12) United States Patent
Van Dan Elzen (10) Patent No.: US 10,298,818 B2
(45) Date of Patent: May 21, 2019

(54) VEHICLE CAMERA WITH ENHANCED IMAGER AND PCB ASSEMBLY

(71) Applicant: MAGNA ELECTRONICS INC., Auburn Hills, MI (US)

(72) Inventor: Christopher L. Van Dan Elzen, Rochester, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 454 days.

(21) Appl. No.: 15/076,916

(22) Filed: Mar. 22, 2016

(65) Prior Publication Data

US 2016/0286103 A1 Sep. 29, 2016

Related U.S. Application Data

(60) Provisional application No. 62/136,677, filed on Mar. 23, 2015.

(51) Int. Cl.
| | |
|---|---|
| *H01L 27/146* | (2006.01) |
| *H04N 5/225* | (2006.01) |
| *H04N 7/18* | (2006.01) |
| *B60R 1/00* | (2006.01) |
| *H05K 1/02* | (2006.01) |
| *H05K 3/34* | (2006.01) |

(52) U.S. Cl.
CPC .............. *H04N 5/2253* (2013.01); *B60R 1/00* (2013.01); *H01L 27/14618* (2013.01); *H04N 7/18* (2013.01); *B60R 2300/105* (2013.01); *H05K 1/0274* (2013.01); *H05K 3/341* (2013.01)

(58) Field of Classification Search
CPC ................. H01L 27/14618; B60R 1/00; B60R 2300/105; H04N 7/18; H05K 3/341; H05K 1/0274
See application file for complete search history.

(56) References Cited

U.S. PATENT DOCUMENTS

| | | |
|---|---|---|
| 5,550,677 A | 8/1996 | Schofield et al. |
| 5,670,935 A | 9/1997 | Schofield et al. |
| 5,715,093 A | 2/1998 | Schierbeek et al. |
| 5,760,962 A | 6/1998 | Schofield et al. |
| 5,786,772 A | 7/1998 | Schofield et al. |
| 5,796,094 A | 8/1998 | Schofield et al. |
| 5,877,897 A | 3/1999 | Schofield et al. |

(Continued)

*Primary Examiner* — Tung T Vo
*Assistant Examiner* — Joseph W Becker
(74) *Attorney, Agent, or Firm* — Honigman LLP (57) ABSTRACT

A camera for a vision system for a vehicle includes an imager chip having an at least partially light transmitting substrate having a photosensor array disposed at a second surface of the at least partially light transmitting substrate so as to sense light that passes through the at least partially light transmitting substrate. The imager chip includes electrically conductive pads disposed at the second surface of the at least partially light transmitting substrate. A circuit element includes circuitry disposed at least at a third surface thereof. The imager chip is mounted at the circuit element with the second surface of the at least partially light transmitting substrate opposing the third surface of the circuit element. Electrical connection between the electrically conductive pads and the circuitry of the circuit element is made when mounting the imager chip at the circuit element.

20 Claims, 4 Drawing Sheets

(56) References Cited

U.S. PATENT DOCUMENTS

| | | |
|---|---|---|
| 5,929,786 A | 7/1999 | Schofield et al. |
| 5,949,331 A | 9/1999 | Schofield et al. |
| 6,097,023 A | 8/2000 | Schofield et al. |
| 6,201,642 B1 | 3/2001 | Bos |
| 6,222,447 B1 | 4/2001 | Schofield et al. |
| 6,302,545 B1 | 10/2001 | Schofield et al. |
| 6,320,176 B1 | 11/2001 | Schofield et al. |
| 6,396,397 B1 | 5/2002 | Bos et al. |
| 6,498,620 B2 | 12/2002 | Schofield et al. |
| 6,523,964 B2 | 2/2003 | Schofield et al. |
| 6,559,435 B2 | 5/2003 | Schofield et al. |
| 6,590,719 B2 | 7/2003 | Bos |
| 6,611,202 B2 | 8/2003 | Schofield et al. |
| 6,636,258 B2 | 10/2003 | Strumolo |
| 6,690,268 B2 | 2/2004 | Schofield et al. |
| 6,717,610 B1 | 4/2004 | Bos et al. |
| 6,757,109 B2 | 6/2004 | Bos |
| 6,802,617 B2 | 10/2004 | Schofield et al. |
| 6,806,452 B2 | 10/2004 | Bos et al. |
| 6,822,563 B2 | 11/2004 | Bos et al. |
| 6,831,261 B2 | 12/2004 | Schofield et al. |
| 6,882,287 B2 | 4/2005 | Schofield |
| 6,891,563 B2 | 5/2005 | Schofield et al. |
| 6,922,292 B2 | 7/2005 | Bos |
| 6,946,978 B2 | 9/2005 | Schofield |
| 7,004,606 B2 | 2/2006 | Schofield |
| 7,005,974 B2 | 2/2006 | McMahon et al. |
| 7,038,577 B2 | 5/2006 | Pawlicki et al. |
| 7,078,791 B1 * | 7/2006 | Tindle ............... H01L 27/14618 257/433 |
| 7,145,519 B2 | 12/2006 | Takahashi et al. |
| 7,161,616 B1 | 1/2007 | Okamoto et al. |
| 7,230,640 B2 | 6/2007 | Regensburger et al. |
| 7,248,283 B2 | 7/2007 | Takagi et al. |
| 7,295,229 B2 | 11/2007 | Kumata et al. |
| 7,301,466 B2 | 11/2007 | Asai |
| 7,339,149 B1 | 3/2008 | Schofield et al. |
| 7,592,928 B2 | 9/2009 | Chinomi et al. |
| 7,720,580 B2 | 5/2010 | Higgins-Luthman |
| 7,855,755 B2 | 12/2010 | Weller et al. |
| 7,859,565 B2 | 12/2010 | Schofield et al. |
| 7,881,496 B2 | 2/2011 | Camilleri et al. |
| 7,965,336 B2 | 6/2011 | Bingle et al. |
| 8,446,470 B2 | 5/2013 | Lu et al. |
| 8,694,224 B2 | 4/2014 | Chundrlik, Jr. et al. |
| 9,307,640 B2 | 4/2016 | Sigle |
| 9,793,309 B2 * | 10/2017 | Seo .................. H01L 27/14627 |
| 2014/0138140 A1 | 5/2014 | Sigle |
| 2015/0325543 A1 * | 11/2015 | Katkar ................ H01L 24/14 257/738 |
| 2016/0198072 A1 | 7/2016 | Wichlacz |

* cited by examiner

VEHICLE CAMERA WITH ENHANCED IMAGER AND PCB ASSEMBLY

CROSS REFERENCE TO RELATED APPLICATION

The present application claims the filing benefits of U.S. provisional application Ser. No. 62/136,677, filed Mar. 23, 2015, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Figure 3:
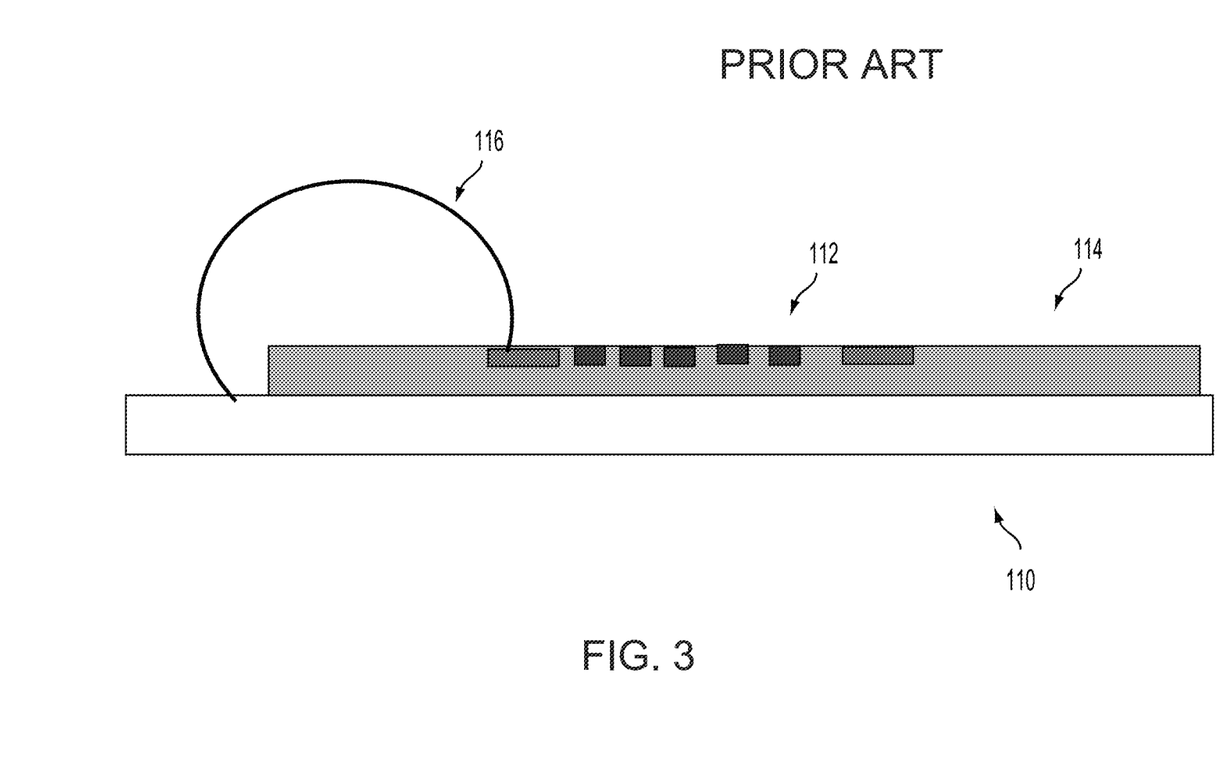
FIG. 3 is a side elevation and sectional view of a known circuit element with imaging circuitry disposed thereat.

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties. Such cameras include a printed circuit board 110 (FIG. 3) with an imaging array 112 of photosensing elements disposed thereat. Typically the imaging array circuitry is disposed at a semiconductor substrate or chip 114 that is mounted to the printed circuit board, with an electrical connection or wire bonding 116 electrically connecting circuitry at the imaging array substrate or chip to circuitry at the printed circuit board. As shown in FIG. 3, the imaging array circuitry is disposed at the surface of the substrate or chip that faces away from the printed circuit board.

SUMMARY OF THE INVENTION

The present invention provides a vision system or imaging system for a vehicle that utilizes one or more cameras (preferably one or more CMOS cameras) to capture image data representative of images exterior of the vehicle, wherein the camera has imaging circuitry disposed at a circuit element or printed circuit board (PCB) of the camera in a manner that provides enhanced assembly of the camera. The photosensing elements of the imager and imaging array circuitry are disposed on a transparent or at least partially visible light transmitting substrate that is mounted to the circuit board with the circuitry (including the photosensing elements and active pads and conductive traces electrically connected to the photosensing elements and active pads) facing or opposing the circuit board, such that electrical connection of the imaging array conductive active pads is made to circuitry of the circuit board when the imaging array circuitry substrate is mounted at the circuit board. The imaging array circuit chip of the present invention (comprising the at least partially light transmitting substrate and photosensing elements and circuit disposed thereat) thus provides enhanced assembly of the camera without requiring an additional connector or wire or wire bonding to be soldered at the imaging array circuitry and at circuitry of the printed circuit board. The photosensors of the imaging array sense light that passes through the at least partially light transmitting substrate.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide a top down or bird's eye or surround view display and may provide a displayed image that is representative of the subject vehicle, and optionally with the displayed image being customized to at least partially correspond to the actual subject vehicle.

Figure 1:
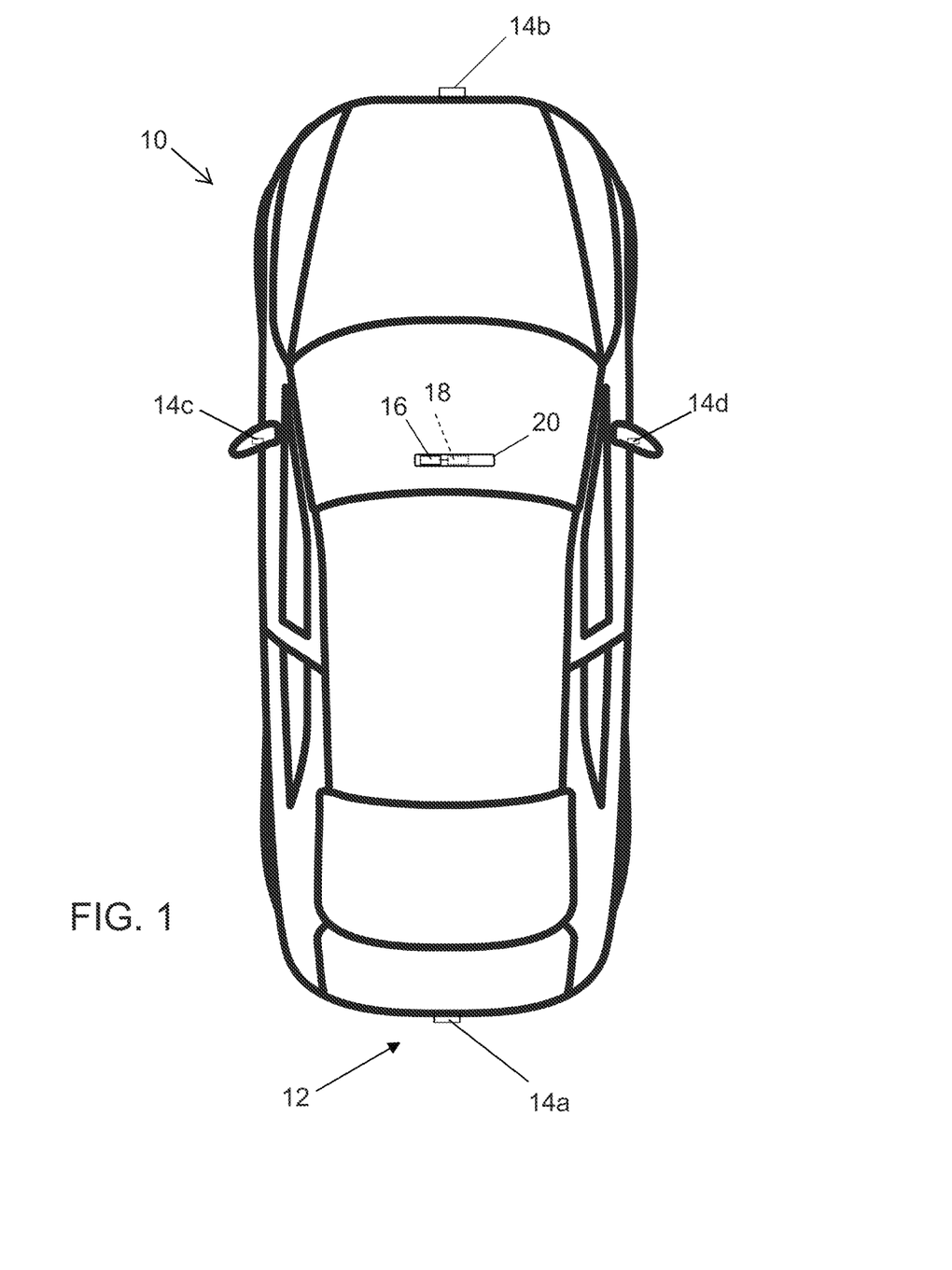
FIG. 1 is a plan view of a vehicle with a vision system that incorporates cameras in accordance with the present invention.

Referring now to the drawings and the illustrative embodiments depicted therein, a vehicle 10 includes an imaging system or vision system 12 that includes at least one exterior facing imaging sensor or camera, such as a rearward facing imaging sensor or camera 14a (and the system may optionally include multiple exterior facing imaging sensors or cameras, such as a forwardly facing camera 14b at the front (or at the windshield) of the vehicle, and a sidewardly/rearwardly facing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) or processor 18 that is operable to process image data captured by the camera or cameras and may detect objects or the like and/or provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

Figure 2:
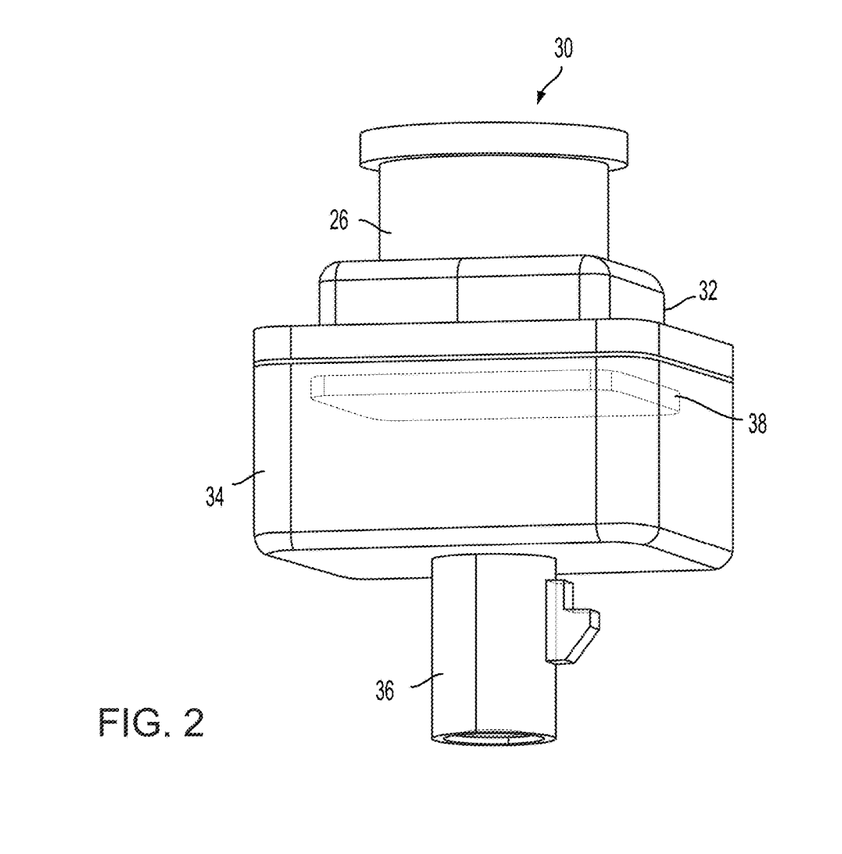
FIG. 2 is a perspective view of a camera having a circuit element and circuitry in accordance with the present invention.
Figure 4:
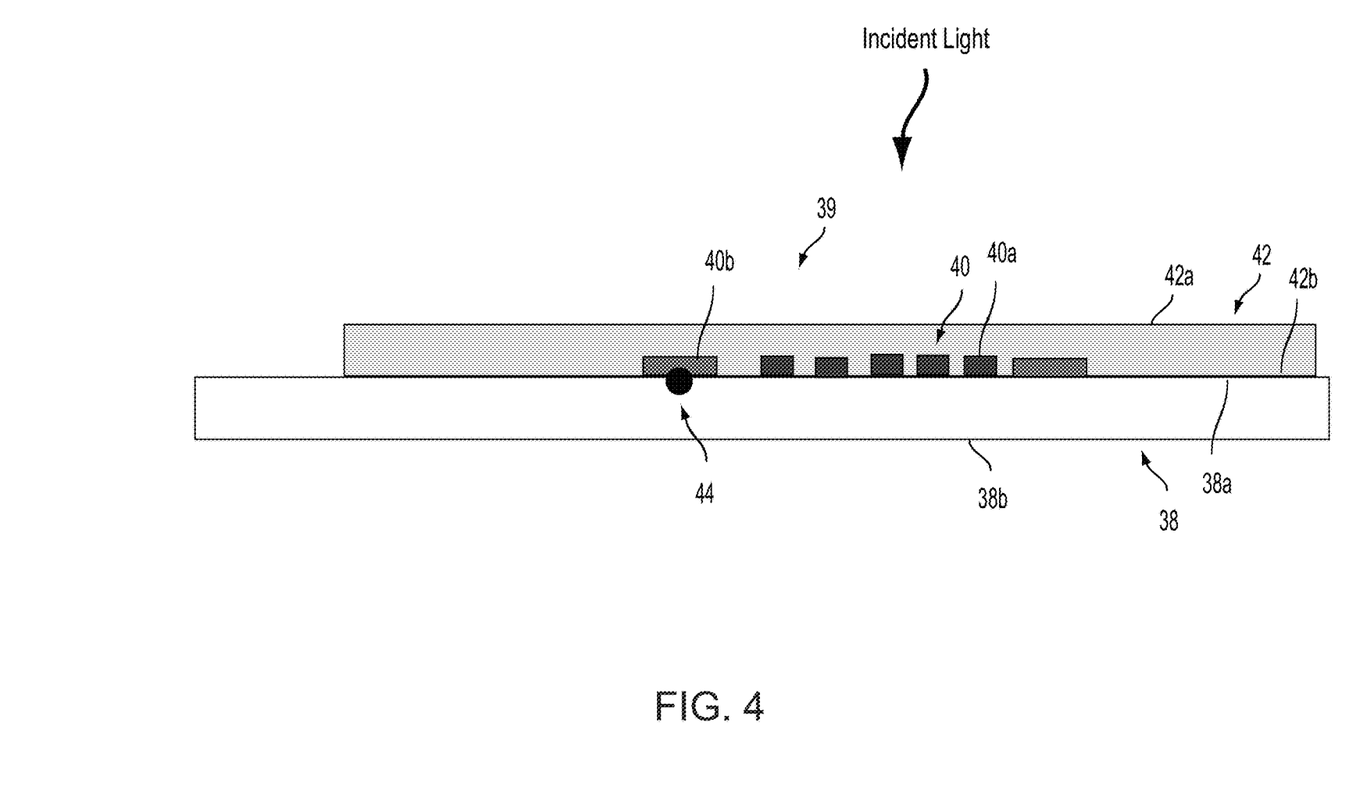
FIG. 4 is a side elevation and sectional view of a circuit element with imaging circuitry disposed thereat in accordance with the present invention.

As shown in FIGS. 2 and 4, the camera or camera module 22 includes an imager 24 at an image plane and a lens holder or lens barrel 26 that holds the lens relative to the imager. During assembly of the camera module, the lens barrel is positioned relative to the imager's image plane to provide the desired focusing of images at the image plane by the lens. For example, the camera module 30 may include a front housing portion 32 and a rear housing portion 34, with the lens barrel 26 mounting at the front housing portion and with an electrical connector 36 (for connecting to a vehicle wiring harness or the like) provided at the rear housing portion. The front and/or rear housing portions support and house a circuit element or printed circuit board 38 therein, with the circuit element having the imager (and associated circuitry) disposed thereat. The lens barrel attaches or mounts to the front housing portion such that, when so attached, the lens may focus (or slightly blur) images at the image plane of the imager. For example, the flange of the lens barrel may engage corresponding structure at the front housing portion during the assembly process to locate the lens barrel and lens relative to the imager and image plane.

As shown in FIG. 4, the printed circuit board or PCB 38 has an imager chip 39 disposed or mounted thereat. The imager chip 39 includes an at least partially light transmitting or transparent or substantially transparent semiconductor substrate 42 having a first or outer surface 42a and a second or inner or mounting surface 42b, with an imaging array of photosensing elements 40a and associated electrical connectors 40b and conductive traces (collectively referred to herein as imager circuitry 40) disposed at the second or mounting surface 42b of the at least partially visible light transmitting or transparent or substantially transparent semiconductor substrate 42. When the substrate 42 is mounted to the circuit board 38, the second or mounting surface 42b of the substrate opposes and contacts and mounts to a third or outer surface 38a of the circuit board 38 (with the third surface 38a and the opposite or fourth surface 38b of the circuit board optionally having circuitry disposed thereat).

Thus, light incident at the imager passes through the transparent or partially transparent substrate 42 so as to be imaged at the sensing surfaces of the photosensing elements 40a which are disposed at and viewing through the substrate 42. The substrate 42 may comprise a transparent or substantially transparent substrate, or may comprise a substrate having a portion of which is transparent or substantially transparent, with the imaging array of photosensing elements disposed at the transparent or substantially transparent portion of the substrate.

As shown in FIG. 4, an electrical connection 44 electrically connects the imager circuitry 40 (such as an active pad or busbar of the imager chip that is electrically conductively connected to the photosensing elements and conductive traces and shift registers and/or the like of the imager chip) at the imaging array substrate 42 or chip 39 to circuitry at the printed circuit board 38. The electrical connection 44 may be made via a raised electrically conductive pad or bump at one of the second surface 42b of the substrate 42 or the third surface 38a of the circuit board 38 and a corresponding electrically conductive pad or recess at the other of the second surface 42b of the substrate 42 or the third surface 38a of the circuit board 38.

The imager circuitry of the imager chip includes the active pads or busbars and photosensing elements and electrically conductive traces and shift registers and/or the like of the imager chip, such as by utilizing aspects of the imagers and imaging arrays and cameras described in U.S. Pat. Nos. 5,796,094; 5,877,897; 5,949,331; 5,670,935 and/or 5,550,677, which are hereby incorporated herein by reference in their entireties.

The camera or imager chip also includes spectral filters to provide the desired color or spectral imaging features of the camera. The spectral filters may be disposed at the substrate and between the sensing elements and the substrate and generally at the mounting surface (so that the light received by the particular photosensing elements passes through the at least partially light transmitting substrate and is filtered or attenuated by the respective filter disposed thereat). Optionally, spectral filters may be placed at the outward facing surface of the imager chip substrate (the surface that faces away from the PCB) and registered with the respective sensing elements. The spectral filters may comprise any suitable filter that filters or attenuates or passes a selected spectral band of light. For example, the spectral filters may comprise red-clear-clear (RCC) filters, red-green-blue (RGB) filters or the like. Optionally the spectral filters may include an infrared (IR) filter or a near infrared (NIR) filter or the like. Optionally, the spectral filtering may be provided at the lens of the camera, such as via a dichroic splitter or prism or other filtering means. The imager chip and spectral filtering may utilize aspects of the imagers and imaging arrays and cameras described in U.S. Pat. Nos. 8,446,470 and/or 5,796,094, which are hereby incorporated herein by reference in their entireties The imager chip thus comprises a light transmitting or at least partially visible light transmitting substrate with the imager photosensor elements and associated busbars and conductive traces and circuitry established thereat (such as by using CMOS (complementary metal-oxide-semiconductor) technology) to provide a CMOS chip or silicon germanium (SiGe) chip or the like. The silicon process starts with a silicon substrate layer and builds p-n junctions (a boundary or interface between two types of semiconductor material) on top of it. The present invention uses a transparent semiconductor substrate that allows the photosensing elements of the imager to be placed or established at the back side or surface of the substrate such that they receive light and gather photons through the substrate at which they are disposed.

Because the metal layer in the CMOS process may be more of a photon blocker than the backside substrate, the chip of the present invention (utilizing a transparent substrate) may be more sensitive to light by flipping the chip around, thus providing a back side illumination chip. When flipped or reversed in this manner, the active pads of the imager chip face the PCB and the transparent substrate of the imager chip faces away from the PCB. Thus, solder balls may be provided on the active pads on the chip, and those solder balls may be set into a solder paste on the PCB when the imager chip is mounted at or placed at the PCB, such as in a similar manner as a ball grid array integrated circuit (BGA IC).

The imager chip 39 is preferably mounted to the circuit board 38 using ball grid array (BGA) surface-mount packaging. In such BGA packaging, electrically conducting pads are established on the underside of imager chip 39, each initially with a tiny ball of solder placed thereat. These solder balls or spheres can be placed manually or by automated equipment, and are preferably held in place with a tacky flux. Circuit board 38 has copper pads in a pattern that matches the layout of the solder balls and electrically conducting pads established on the underside of imager chip 39. Imager chip 39 is then juxtaposed with circuit board 38 with the solder balls between the copper pads of circuit board 38 and the electrically conducting pads that are present on the underside of imager chip 39. The assembly is then heated, either in a reflow oven or by an infrared heater, melting the balls. Surface tension causes the molten solder to hold the package in alignment with the circuit board, at the correct separation distance, while the solder cools and solidifies, forming soldered connections between the imager chip 39 and the circuit board 38. Optionally, solder balls may be used on both imager chip 39 and circuit board 38. A preferred pattern/layout for the copper pads on imager chip 39 may be similar to that disclosed in U.S. Pat. No. 9,307, 640, which is hereby incorporated herein by reference in its entirety.

The present invention thus provides an enhanced process for providing the imager chip at the PCB and electrically connecting the imager active pads and associated conductive traces and photosensing elements and circuitry to the pads or connectors and associated circuitry of the PCB. The present invention avoids the prior use of wire bonding and wire bond active pads to electrically connect the imager circuitry to the PCB, which were previously required because the active pads were created on top of the substrate (on the side facing away from the PCB).

Thus, the present invention provides for enhanced assembly of the camera circuit board and imaging array or imager chip. The imaging array photosensing elements and conductive busbars or pads and associated conductive traces and circuitry are disposed at or established at the mounting surface of the transparent substrate or chip that faces the printed circuit board, such that electrical connection to circuitry at the PCB is made as the imager chip (with imaging array circuitry disposed thereat) is mounted at the PCB. The system and camera of the present invention avoids use of wire bonding, since the electrical connections are made between the opposed surfaces of the transparent substrate and the PCB, such as via solder balls or bump connections at the chip and PCB or the like. Thus, the imager chip may be readily mounted at the circuit board via picking and placing the imager chip onto the circuit board, whereby electrical connection is made at the time of mounting the imager chip to the circuit board (which may be mounted using surface mounting technology (SMT) or the like). The electrical connection may be made utilizing aspects of U.S. Pat. No. 9,307,640, which is hereby incorporated herein by reference in its entirety.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an EyeQ2 or EyeQ3 image processing chip available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ladar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, which are all hereby incorporated herein by reference in their entireties. The system may communicate with other communication systems via any suitable means, such as by utilizing aspects of the systems described in International Publication Nos. WO/2010/144900; WO 2013/043661 and/or WO 2013/081985, and/or U.S. Publication No. US-2012-0062743, which are hereby incorporated herein by reference in their entireties.

The imaging device and control and image processor and any associated illumination source, if applicable, may comprise any suitable components, and may utilize aspects of the cameras and vision systems described in U.S. Pat. Nos. 5,550,677; 5,877,897; 6,498,620; 5,670,935; 5,796,094; 6,396,397; 6,806,452; 6,690,268; 7,005,974; 7,937,667; 7,123,168; 7,004,606; 6,946,978; 7,038,577; 6,353,392; 6,320,176; 6,313,454 and/or 6,824,281, and/or International Publication Nos. WO 2010/099416; WO 2011/028686 and/or WO 2013/016409, and/or U.S. publication Nos. US 2010-0020170 and/or US-2013-0002873, which are all hereby incorporated herein by reference in their entireties. The camera or cameras may comprise any suitable cameras or imaging sensors or camera modules, and may utilize aspects of the cameras or sensors described in U.S. Publication No. US-2009-0244361 and/or U.S. Pat. Nos. 8,542, 451; 7,965,336 and/or 7,480,149, which are hereby incorporated herein by reference in their entireties. The imaging array sensor may comprise any suitable sensor, and may utilize various imaging sensors or imaging array sensors or cameras or the like, such as a CMOS imaging array sensor, a CCD sensor or other sensors or the like, such as the types described in U.S. Pat. Nos. 5,550,677; 5,670,935; 5,760, 962; 5,715,093; 5,877,897; 6,922,292; 6,757,109; 6,717,610; 6,590,719; 6,201,642; 6,498,620; 5,796,094; 6,097,023; 6,320,176; 6,559,435; 6,831,261; 6,806,452; 6,396,397; 6,822,563; 6,946,978; 7,339,149; 7,038,577; 7,004,606; 7,720,580 and/or 7,965,336, and/or International Publication Nos. WO/2009/036176 and/or WO/2009/046268, which are all hereby incorporated herein by reference in their entireties.

The camera module and circuit chip or board and imaging sensor may be implemented and operated in connection with various vehicular vision-based systems, and/or may be operable utilizing the principles of such other vehicular systems, such as a vehicle headlamp control system, such as the type disclosed in U.S. Pat. Nos. 5,796,094; 6,097,023; 6,320,176; 6,559,435; 6,831,261; 7,004,606; 7,339,149 and/or 7,526,103, which are all hereby incorporated herein by reference in their entireties, a rain sensor, such as the types disclosed in commonly assigned U.S. Pat. Nos. 6,353,392; 6,313,454; 6,320,176 and/or 7,480,149, which are hereby incorporated herein by reference in their entireties, a vehicle vision system, such as a forwardly, sidewardly or rearwardly directed vehicle vision system utilizing principles disclosed in U.S. Pat. Nos. 5,550,677; 5,670,935; 5,760,962; 5,877,897; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978 and/or 7,859,565, which are all hereby incorporated herein by reference in their entireties, a trailer hitching aid or tow check system, such as the type disclosed in U.S. Pat. No. 7,005,974, which is hereby incorporated herein by reference in its entirety, a reverse or sideward imaging system, such as for a lane change assistance system or lane departure warning system or for a blind spot or object detection system, such as imaging or detection systems of the types disclosed in U.S. Pat. Nos. 7,881,496; 7,720,580; 7,038,577; 5,929,786 and/or 5,786,772, which are hereby incorporated herein by reference in their entireties, a video device for internal cabin surveillance and/or video telephone function, such as disclosed in U.S. Pat. Nos. 5,760,962; 5,877,897; 6,690,268 and/or 7,370,983, and/or U.S. Publication No. US-2006-0050018, which are hereby incorporated herein by reference in their entireties, a traffic sign recognition system, a system for determining a distance to a leading or trailing vehicle or object, such as a system utilizing the principles disclosed in U.S. Pat. Nos. 6,396,397 and/or 7,123,168, which are hereby incorporated herein by reference in their entireties, and/or the like.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A camera for a vision system for a vehicle, said camera comprising:
    an imager chip comprising an at least partially light transmitting substrate having a first surface and a second surface opposite said first surface, said imager chip comprising a photosensor array disposed at said second surface of said at least partially light transmitting substrate, said photosensor array having a plurality of photosensing elements that sense light passing through said at least partially light transmitting substrate;
    wherein said imager chip comprises electrically conductive pads disposed in a pattern at said second surface of said at least partially light transmitting substrate;
    a circuit element comprising a third surface and a fourth surface opposite said third surface, said circuit element comprising circuitry disposed at least at said third surface, wherein said circuitry includes a plurality of electrically conductive pads disposed in a pattern at said third surface of said circuit element;
    wherein said imager chip is mounted at said circuit element with said second surface of said at least partially light transmitting substrate opposing said third surface of said circuit element, with said plurality of photosensing elements disposed between said at least partially light transmitting substrate and said circuit element; and
    wherein electrical connection between said electrically conductive pads at said second surface of said at least partially light transmitting substrate of said imager chip and said electrically conductive pads at said third surface of said circuit element is made via soldering said electrically conductive pads at said second surface of said at least partially light transmitting substrate of said imager chip to corresponding ones of said electrically conductive pads at said third surface of said circuit element when mounting said imager chip at said circuit element.

2. The camera of claim 1, wherein said electrical connection is made without wire bonding.

3. The camera of claim 1, wherein said at least partially light transmitting substrate comprises an at least partially light transmitting semiconductor substrate.

4. The camera of claim 1, wherein said circuit element comprises a printed circuit board.

5. The camera of claim 1, wherein said imager chip comprises imager circuitry disposed at said second surface of said at least partially light transmitting substrate.

6. The camera of claim 1, wherein said electrically conductive pads at said second surface of said at least partially light transmitting substrate are electrically connected to correspondingly arranged electrically conductive pads of said circuitry at said third surface of said circuit element when mounting said imager chip at said circuit element.

7. The camera of claim 6, wherein said electrically conductive pads at said second surface of said at least partially light transmitting substrate of said imager chip are electrically connected to said electrically conductive pads of said circuitry of said circuit element via (a) solder balls disposed at one of (i) said electrically conductive pads of said imager chip and (ii) said electrically conductive pads of said circuit element, and (b) solder paste at the other of (i) said electrically conductive pads of said imager chip and (ii) said electrically conductive pads of said circuit element.

8. The camera of claim 1, wherein said electrically conductive pads are arranged at said second surface of said at least partially light transmitting substrate in a pattern that generally matches a pattern of said electrically conductive pads established at said third surface of said circuit element.

9. The camera of claim 8, wherein said electrically conductive pads of said imager chip are electrically connected to said electrically conductive pads of said circuit element via respective solder balls disposed between respective pads.

10. The camera of claim 9, wherein said solder balls comprise a ball grid array comprising a plurality of solder balls disposed at said electrically conductive pads of said imager chip or said electrically conductive pads of said circuit element.

11. The camera of claim 1, wherein said imager chip comprises spectral filtering, and wherein said spectral filtering comprises a spectral filtering array established at said at least partially light transmitting substrate and in front of said photosensing elements so that light passing through said at least partially light transmitting substrate passes through said spectral filtering array for sensing by said photosensing elements.

12. The camera of claim 1, wherein said imager chip comprises spectral filtering, and wherein said spectral filtering comprises a spectral filtering array disposed between said photosensing elements and said second surface of said at least partially light transmitting substrate.

13. A camera for a vision system for a vehicle, said camera comprising:
- an imager chip comprising an at least partially light transmitting substrate having a first surface and a second surface opposite said first surface, said imager chip comprising a photosensor array disposed at said second surface of said at least partially light transmitting substrate, said photosensor array having a plurality of photosensing elements that sense light passing through said at least partially light transmitting substrate;
- wherein said at least partially light transmitting substrate comprises an at least partially light transmitting semiconductor substrate;
- wherein said imager chip comprises electrically conductive pads disposed at said second surface of said at least partially light transmitting substrate;
- a circuit element comprising a third surface and a fourth surface opposite said third surface, said circuit element comprising circuitry disposed at least at said third surface;
- wherein said circuit element comprises a printed circuit board;
- wherein said circuit element comprises a plurality of electrically conductive pads disposed at said third surface of said circuit element and in electrical connection with said circuitry;
- wherein said imager chip is mounted at said circuit element with said second surface of said at least partially light transmitting substrate opposing said third surface of said circuit element, with said plurality of photosensing elements disposed between said at least partially light transmitting substrate and said circuit element; and
- wherein electrical connection between said electrically conductive pads at said second surface of said at least partially light transmitting substrate of said imager chip and corresponding ones of said electrically conductive pads at said third surface of said circuit element is made via soldering said electrically conductive pads at said second surface of said at least partially light transmitting substrate of said imager chip to said electrically conductive pads at said third surface of said circuit element when mounting said imager chip at said circuit element.

14. The camera of claim 13, wherein said imager chip comprises imager circuitry disposed at said second surface of said at least partially light transmitting substrate.

15. The camera of claim 13, wherein said electrically conductive pads are electrically connected to corresponding electrically conductive pads of said circuitry of said circuit element via (a) solder balls disposed at one of (i) said electrically conductive pads of said imager chip and (ii) said electrically conductive pads of said circuit element, and (b) solder paste at the other of (i) said electrically conductive pads of said imager chip and (ii) said electrically conductive pads of said circuit element.

16. The camera of claim 13, wherein said electrically conductive pads are arranged at said second surface of said at least partially light transmitting substrate in a pattern that generally matches a pattern of said electrically conductive pads at said third surface of said circuit element.

17. The camera of claim 16, wherein said electrically conductive pads of said imager chip are electrically connected to said electrically conductive pads of said circuit element via respective solder balls disposed between respective pads.

18. A camera for a vision system for a vehicle, said camera comprising:
- an imager chip comprising an at least partially light transmitting substrate having a first surface and a second surface opposite said first surface, said imager chip comprising a photosensor array disposed at said second surface of said at least partially light transmitting substrate, said photosensor array having a plurality of photosensing elements that sense light passing through said at least partially light transmitting substrate;
- wherein said imager chip comprises electrically conductive pads disposed at said second surface of said at least partially light transmitting substrate;
- a circuit element comprising a third surface and a fourth surface opposite said third surface, said circuit element comprising circuitry disposed at least at said third surface;
- wherein said circuit element comprises a plurality of electrically conductive pads disposed at said third surface of said circuit element;
- wherein said electrically conductive pads of said imager chip are arranged at said second surface of said at least partially light transmitting substrate in a pattern that generally matches a pattern of said electrically conductive pads arranged at said third surface of said circuit element;
- wherein said imager chip is mounted at said circuit element with said second surface of said at least partially light transmitting substrate opposing said third surface of said circuit element, with said plurality of photosensing elements disposed between said at least partially light transmitting substrate and said circuit element;
- wherein electrical connection between said electrically conductive pads at said second surface of said at least partially light transmitting substrate of said imager chip and corresponding ones of said electrically conductive pads at said third surface of said circuit element is made when mounting said imager chip at said circuit element; and
- wherein said electrically conductive pads of said imager chip are electrically connected to said electrically conductive pads of said circuit element via respective solder balls disposed between respective corresponding ones of said electrically conductive pads, and wherein said solder balls comprise a ball grid array.

19. The camera of claim 18, wherein said imager chip comprises imager circuitry disposed at said second surface of said at least partially light transmitting substrate.

20. The camera of claim 18, wherein said electrically conductive pads of said imager chip are electrically connected to corresponding ones of said electrically conductive pads of said circuit element via (a) solder balls disposed at one of (i) said electrically conductive pads of said imager chip and (ii) said electrically conductive pads of said circuit element, and (b) solder paste at the other of (i) said electrically conductive pads of said imager chip and (ii) said electrically conductive pads of said circuit element.

* * * * *